United States Patent [19]

Lee

[11] Patent Number: 4,528,581

[45] Date of Patent: Jul. 9, 1985

[54] HIGH DENSITY CMOS DEVICES WITH CONDUCTIVELY INTERCONNECTED WELLS

[75] Inventor: William W. Y. Lee, Fountain Valley, Calif.

[73] Assignee: Hughes Aircraft Company, El Segundo, Calif.

[21] Appl. No.: 569,064

[22] Filed: Jan. 9, 1984

Related U.S. Application Data

[62] Division of Ser. No. 313,395, Oct. 21, 1981, Pat. No. 4,426,766.

[51] Int. Cl.³ .................. H01L 27/04; H01L 29/78
[52] U.S. Cl. .................. 357/23.11; 357/41; 357/42; 357/52
[58] Field of Search .................. 357/41, 42, 52, 23 CS

[56] References Cited

U.S. PATENT DOCUMENTS

| | | | |
|---|---|---|---|
| 3,986,896 | 10/1976 | Ueno et al. | 148/1.5 |
| 4,013,484 | 3/1977 | Boleky et al. | 148/1.5 |
| 4,045,250 | 8/1977 | Dingwall | 148/187 X |
| 4,046,606 | 9/1977 | Lambert | 148/187 |
| 4,047,284 | 9/1977 | Spadea | 29/571 |
| 4,110,899 | 9/1978 | Nagasawa et al. | 29/571 |
| 4,277,291 | 7/1981 | Cerofolini et al. | 148/1.5 |
| 4,306,916 | 12/1981 | Wollesen et al. | 148/187 X |
| 4,313,768 | 2/1982 | Sanders et al. | 148/187 X |
| 4,314,857 | 2/1982 | Aitken | 148/187 X |
| 4,315,781 | 2/1982 | Henderson et al. | 148/1.5 |

OTHER PUBLICATIONS

"RCA COS/MOS Integrated Circuits Manuel", RCA Corp., 1971, pp. 1, 24, 25.
Douglas et al., "Surface Doping Using Ion Implantation for Optimum Guard Layer Design in COS/MOS Structures", IEEE Transactions on Electron Devices, vol. Ed-22, No. 10, Oct. 1975, pp. 849-857.

Primary Examiner—William D. Larkins
Assistant Examiner—Charles S. Small, Jr.
Attorney, Agent, or Firm—W. J. Bethurum; A. W. Karambelas

[57] ABSTRACT

A process of fabricating high density CMOS integrated circuits having conductively interconnected wells. The conductive interconnection is provided by a buried conductor formed in combination with channel stops encircling each of the wells and prior to the fabrication of FET active devices at the surface of the wells. The channel stops, as provided by the process, are automatically aligned with and spaced apart from the source and drain regions of their respective FETs.

4 Claims, 11 Drawing Figures

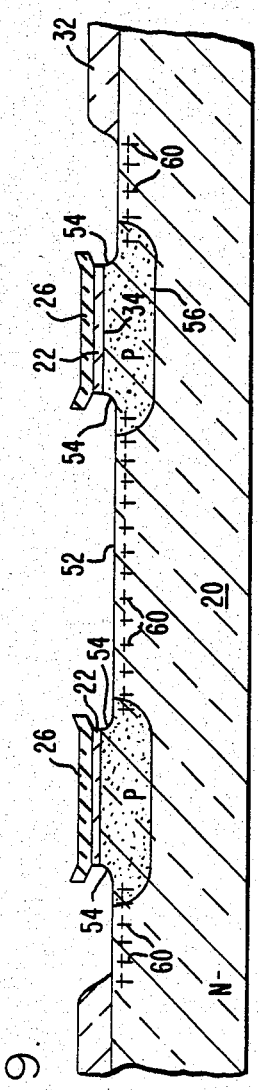
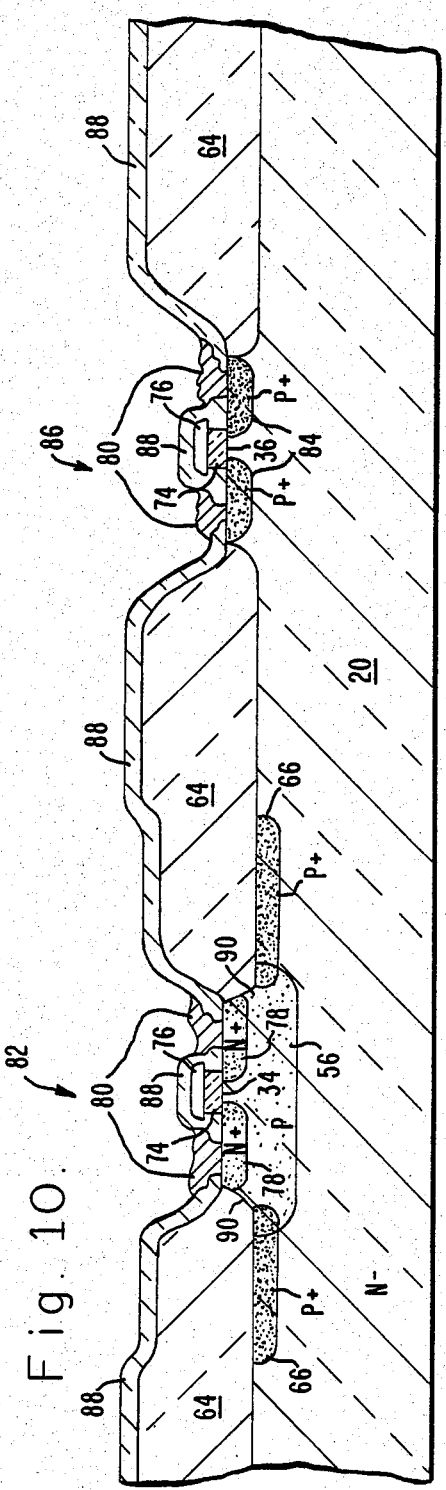
Fig. 9
Fig. 10

HIGH DENSITY CMOS DEVICES WITH CONDUCTIVELY INTERCONNECTED WELLS

This is a division of application Ser. No. 313,395, filed Oct. 21, 1981, now U.S. Pat. No. 4,426,766.

BACKGROUND OF THE INVENTION

The present invention relates generally to the fabrication of complementary insulated gate field effect transistors (commonly referred to as a CMOS FET or CMOS Device) and, more particularly, to a process of fabricating high density complementary insulated gate field effect transistors (HCMOS FETs) having conductively interconnected wells.

The well-known CMOS FET device is typically composed of a closely spaced and appropriately interconnected pair of n-channel and p-channel field effect transistors. The CMOS device is usually fabricated on an n-type semiconductor substrate, with the p-channel transistor being formed at the surface of the substrate and the n-channel transistor being formed at the surface of a p-type layer (p-well) doped into the substrate. The n and p-type transistors are then interconnected by polysilicon and metalization layers to form a CMOS FET device. As a building block for much larger and more complex integrated circuits, CMOS FETs provide a number of notable advantages including high noise immunity, low power-speed product, and near zero standby power requirement.

One significant disadvantage to the use of conventional CMOS devices in large scale integrated (LSI) circuits is that they inherently require a greater amount of substrate surface area than either functionally equivalent n- or p-channel FET devices. For example, the CMOS device density in an integrated circuit can be up to 40% less than the device density achieved by using conventional n-MOS technology.

This size disadvantage is directly related to the amount of substrate surface area required by each p-well. Naturally, the well surface must be sufficient to allow for alignment and processing latitudes in the CMOS fabrication procedure, thereby ensuring that the n- and p-channel transistors are suitably situated with respect to the p-well. However, in conventional CMOS devices, it must also be sufficient to allow for an electrical contact, separate from the n-channel transistor, to be placed on the well surface. This contact, further connected to an appropriate voltage potential source, is required in order to electrically isolate the well from the substrate by reverse biasing the well/substrate junction.

Another disadvantage arises when LSI CMOS devices are used in high voltage applications. In order to increase device density as much as possible, the parasitic channel stop associated with each transistor is allowed to overlap the transistor's source and drain regions. As is well known, channel stops are necessary to prevent the formation of parasitic channels between neighboring transistors. Typically, the channel stops are highly doped regions formed in the substrate surrounding each transistor and effectively block the formation of parasitic channels by substantially increasing the substrate's surface inversion threshold voltage. Also, they are by necessity the opposite in conductivity type from the source and drain regions they overlap in order to prevent shorting. This, however, results in the formation of highly doped and, therefore, low reverse breakdown voltage p-n junctions. Consequently, the maximum operating voltage potential of the CMOS integrated circuit is significantly limited.

SUMMARY OF THE INVENTION

A process is described for fabricating highly dense CMOS integrated circuits having conductively interconnected wells. The conductive interconnection is provided by first removing a contiguous portion of the field oxide layer, including that portion overlying the margin of each of the wells, to expose the underlying portion of the substrate surface. An impurity is then ion implanted under the exposed substrate surface to form an impurity layer overlapping and extending between each of the wells. By annealing this layer, a highly doped region is formed at the surface of the substrate that acts as a channel stop for each active device fabricated in the wells and as a highly conductive buried conductor interconnecting each of the wells.

By this process, the present invention permits a significant reduction in the amount of substrate surface area required by each well. Only a single well contact, further connected to an appropriate voltage potential source, is needed to reverse bias the well/substrate junctions of the interconnected wells.

Another advantage of the present invention is the provision of an automatically aligned separation between the source and drain regions of a transistor formed at the surface of the substrate and the channel stop surrounding the transistor. This aligned separation is provided by forming an oxygen impermeable mask over a first substrate region, on which the transistor is to be fabricated and which is spaced apart from a second substrate region. This mask also covers the substrate region interposed between the first and second regions. An oxide layer is then grown over the surface of the second substrate region. This layer includes an oxide beak that grows, by lateral oxidation, between the mask and the substrate so as to overlie only the interposed substrate region. Next, the oxide layer and beak are removed to expose the underlying substrate surface. An impurity is then ion implanted into the second substrate region to form a channel stop spaced apart from the first substrate region. By performing this implant at low energy, the mask effectively shields the interposing substrate region against the impurity ions. Another oxide layer is grown over the second substrate region with an oxide beak extending over the interposing substrate region. Consequently, when the mask is removed and the source and drain regions are formed in the first substrate region, using the oxide layer and beak as a shield against impurities for the interposing and second substrate regions, they are automatically aligned apart from the channel stop by the interposing substrate region. Since this interposing region is only lightly doped (the original doping level of the substrate), the reverse breakdown voltage of the resulting p-n junction is substantially greater than that of the p-n junction formed by the overlapping of a transistor's source and drain regions and its associated channel stop.

Still another advantage of the present invention is that it provides the above enumerated advantages without necessitating any additional processing steps.

These and other attendant advantages of the present invention will become apparent and readily appreciated as the same becomes better understood by reference to the following detailed description when considered in connection with the accompanying drawings, in which

BRIEF DESCRIPTION OF THE DRAWINGS

FIG. 9 illustrates in cross-sectional form the wells of two different CMOS devices conductively interconnected by a buried conductor at an equivalent processing step as that of FIG. 6;

FIG. 10 illustrates in cross-section form one possible configuration of a completed HCMOS device.

DETAILED DESCRIPTION OF THE INVENTION

Figure 1:
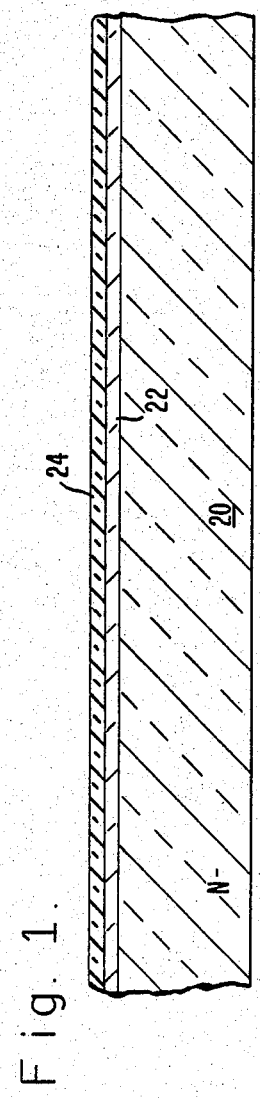
FIGS. 1-8 illustrate in cross-sectional form a CMOS device at successive steps of fabrication in accordance with the preferred embodiment of the invention.

Referring now to the drawings which illustrate the successive processing steps for manufacturing complementary transistors according to the present invention, FIG. 1 shows a semiconductor substrate 20, preferably of silicon and suitably doped to have an n-type conductivity (a concentration of approximately $3 \times 10^{15}/cm^3$ of an n-type dopant), on which a relatively thin, approximately 700 Angstroms thick, silicon dioxide ($SiO_2$) layer has been grown. This oxide growth may be by any conventional method such as thermal oxidation in a suitable ambient. An oxygen impermeable layer 24, preferably of silicon nitride ($Si_3N_4$), is then deposited onto the surface of the oxide layer 22. The silicon nitride layer may be formed by any conventional deposition method so as to have a thickness of approximately 1,000 Angstroms.

Figure 2:
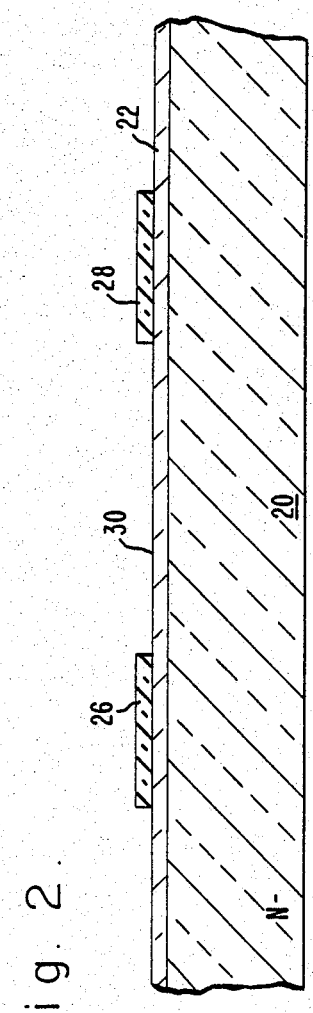

Next, portions of the silicon nitride layer 24 are selectively etched away to leave a plurality of paired first and second nitride masks, one such pair 26, 28 being shown in FIG. 2. It is at the substrate surface underlying these paired masks that the paired n- and p-channel transistors of each CMOS device are to be fabricated in the final step of the disclosed process. The selective etching of the silicon nitride layer may be by a nitride plasma etch and suitably performed to leave the thin oxide layer 22 intact.

Figure 3:
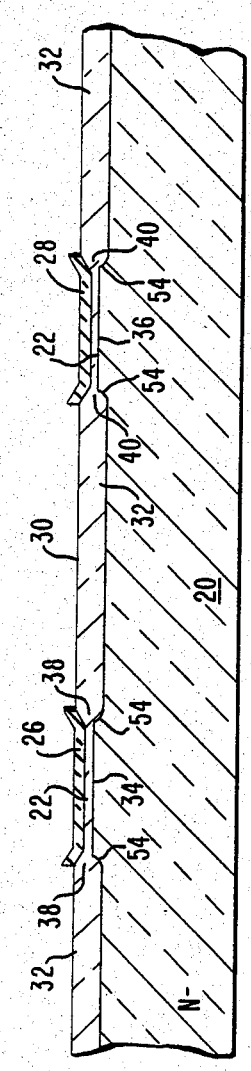

An additional thickness of silicon dioxide is then grown on the exposed portions 30 of the oxide layer 22. As shown in FIG. 3, this oxide growth, which may also be performed by any conventional oxide growth method to provide a total oxide thickness of approximately 3,800 Angstroms, results in the formation of an intermediate field oxide layer 32. The silicon nitride masks 26, 28, being oxygen impermeable, substantially prevent the further growth of the thin oxide layer 22 in the areas underlying the masks. The growth that does occur, as is generally known and expected, is caused by lateral oxidation during the growth of the intermediate field oxide layer 32. This results in the formation of oxide beaks 38, 40 that extend between the margin of the nitride masks 26, 28 and the respectively underlying portions of the semiconductor substrate 20. As a result of the oxide beak formation, the undercut margins of the nitride masks are forced upward while the respectively underlying portions of the substrate are reduced by oxidation to produce downwardly curved portions of the substrate surface 54. Thus, the beaks 38, 40 act to delimit first and second unreduced substrate surface areas 34, 36 symmetrically underlying the first and second nitride masks 26, 28 respectively. These surface areas 34, 36 also underlie the remaining portions of the thin oxide layer 22.

Figure 4:
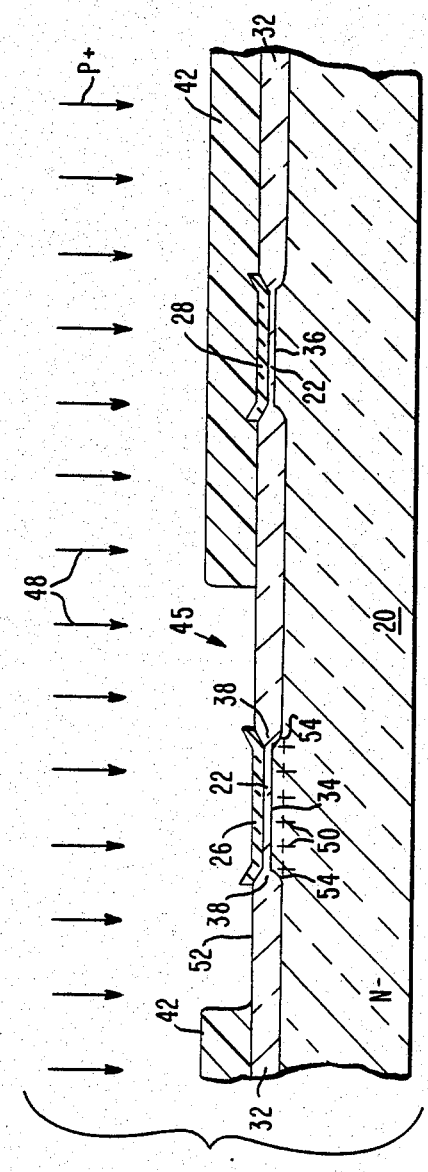

Referring now to FIG. 4, an etch resistant mask 42 is formed by covering the intermediate field oxide layer 32 and the silicon nitride masks 26, 28 with a photoresist material. A window 45 is then opened to expose each of the first silicon nitride masks 26, under which well layers are to be formed, and that portion of the intermediate field oxide surface 52 immediately surrounding and extending between each neighboring first nitride mask 26. A thin zone of p-type impurity ions 50 is then ion implanted, as indicated by the arrows 48, into the surface of the substrate 20. This ion bombardment is performed using conventional ion implantation techniques, at an implant energy sufficient to allow the impurity ions to pass through the first nitride masks 26 and the underlying thin oxide pad 22 but insufficient to cause the impurity ions to pass through either the intermediate field oxide layer 32 or the photoresist mask layer 42 overlying the second nitride masks 28. Consequently, the resulting zones of p-type impurity ions are coextensive with the first surface areas 34 and delimited by the downwardly sloped portions of the substrate surface 54. Preferably, a boron implant at 80 KeV is used to provide a surface concentration of $1 \times 10^{13}/cm^2$.

Figure 5:
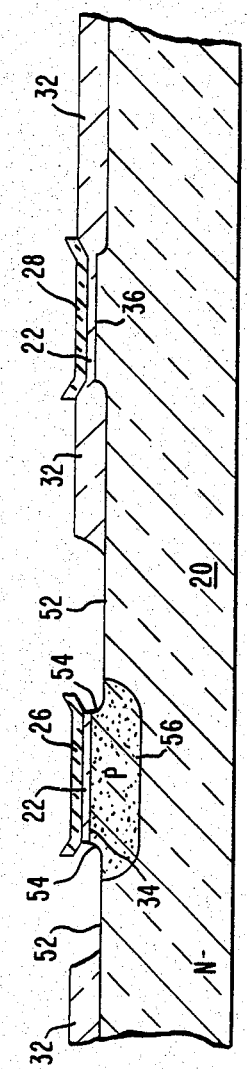

A standard oxide etch utilizing the etch resistant mask 42 is then performed to completely remove the exposed portions 45 of the intermediate field oxide layer 32. The oxide beak 38 is also etched away at this point while leaving the thin oxide pad 22, which underlies and is protected by the first nitride mask 26. Thus, portions of the substrate surface 52 extending between each of the first surface areas 34, including the downwardly curved portion 54 surrounding each, are exposed, as is shown in FIG. 5. The photoresist mask 42 is then removed.

Next, the zones of p-type impurity ions are thermally diffused into the bulk of the substrate 20 to form a p-well beneath each. As a result, the laterally diffused edges of the p-wells extend beyond, yet remain symmetrically aligned with, the edges of their respective nitride masks 26. This drive-in diffusion is preferably performed in an inert atmosphere, such as nitrogen, at a temperature of approximately 1,180° C. for a period of approximately 27 hours to produce p-wells having a conductivity of approximately 2000 ohm/sq.

Figure 6:
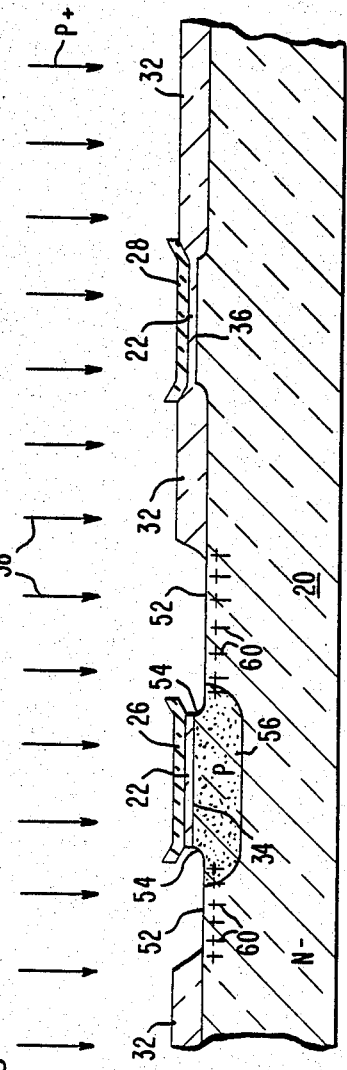

Following the well drive-in diffusion, a second ion implantation of p-type impurities is performed. This ion bombardment, generally indicated by the arrows 58 in FIG. 6, is performed at an implant energy sufficient for the ions to penetrate the exposed portions of the substrate surface 52, but insufficient to penetrate either the nitride masks 26, 28 or the remaining portions of the intermediate field oxide layer. This creates a zone of ions 60 at the surface of the substrate which surrounds each of the wells 56 to act as channel stops. These channel stops, however, do not extend under the downwardly curved portions of the substrate surface 54, since those portions of the substrate are shielded during the ion bombardment by the overhanging margins of the nitride masks 26. Consequently, these channel stops are inherently aligned with, and spaced apart from the source and drain regions of the n-channel FET eventually formed under the first surface area 34 of each of the wells 56.

Figure 7:
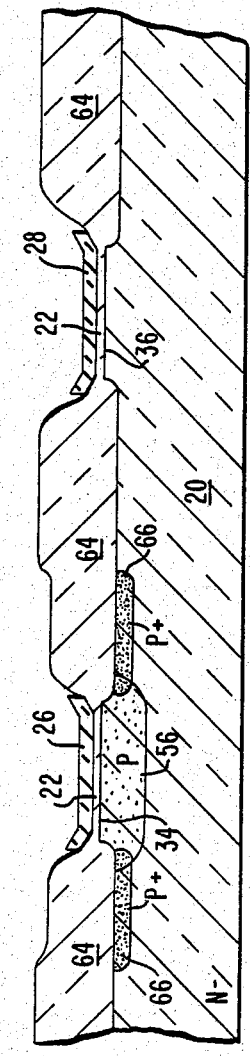

Referring now to FIG. 9, which show the well portions of two separate, but neighboring or adjacent CMOS devices, it can be seen that this zone of ions 60 is also implanted beneath the exposed surface of the substrate 52 extending between the neighboring p-wells 56. Since the diffused edges of the wells 56 extend beyond the edges of the nitride masks 26, the zone 60 overlaps the periphery of each of the wells. Thus, it forms a buried conductor that conductively interconnects the adjacent wells 56. In the present process, this zone is preferably formed by a boron implant at 10 KeV to obtain a surface concentration level of between $7 \times 10^{13}$ to $2.5 \times 10^{14}/cm^2$. A thick layer of oxide is then grown on the exposed portions of the substrate surface 52 and the remaining field oxide layer 32, by low temperature thermal oxidation in a suitable ambient to form a relatively thick final field oxide layer 64, as illustrated in FIG. 7. This step is performed at a low temperature to prevent any further lateral diffusion of the p-well, but at a temperature sufficient to anneal and, thereby, to complete the formation of the parasitic channel stops 66 surrounding each of the wells and the buried conductors (not shown) that interconnects the adjacent wells. Preferably, the oxide is grown at a temperature of approximately 925° C. for a time period sufficient to produce a final field oxide layer 64 having a thickness of approximately 1.2 micron. The conductivity of the annealed channel stops and buried conductors should be equal to or greater than the conductivity of the p-wells.

Figure 8:
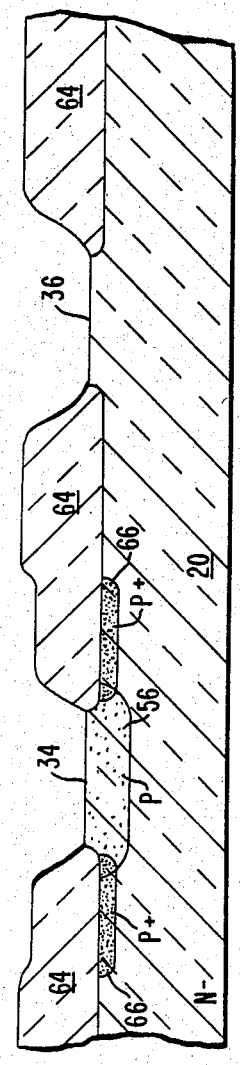

Following the growth of the final field oxide layer 64, all of the first and second nitride masks 26, 28 and the underlying thin oxide layers 22 are removed to expose the first and second surface areas 34, 36, as shown in FIG. 8.

At this point, literally any method of fabricating n- and p-channel field effect transistors on these surface areas can be used. A preferable series of steps leading to the production of the structure shown in FIG. 10 includes forming an n-doped polysilicon gate electrode 76 on an insulating gate oxide layer 74 located on the surface of each of the substrate surface areas 34, 36. This is followed by ion implanting n-type impurities into the surface of the first surface region 34 to form source-and-drain regions 78 for an n-channel FET 82 and p-type impurities into the second surface region 36 to form p-type source-and-drain regions 84 to produce a p-channel FET 86. Since the source and drain regions of the n-channel FET 82 remain largely beneath the first surface region 34, the channel stop 66 is spaced apart from the source and drain regions 78 by the interposed substrate region 90. As previously discussed, the reverse breakdown voltage of the p-n junction formed by the source and drain regions 78 and the interposed region 90 is significantly greater than that formed by allowing the highly doped channel stop to overlap the source and drain regions.

Figure 11:
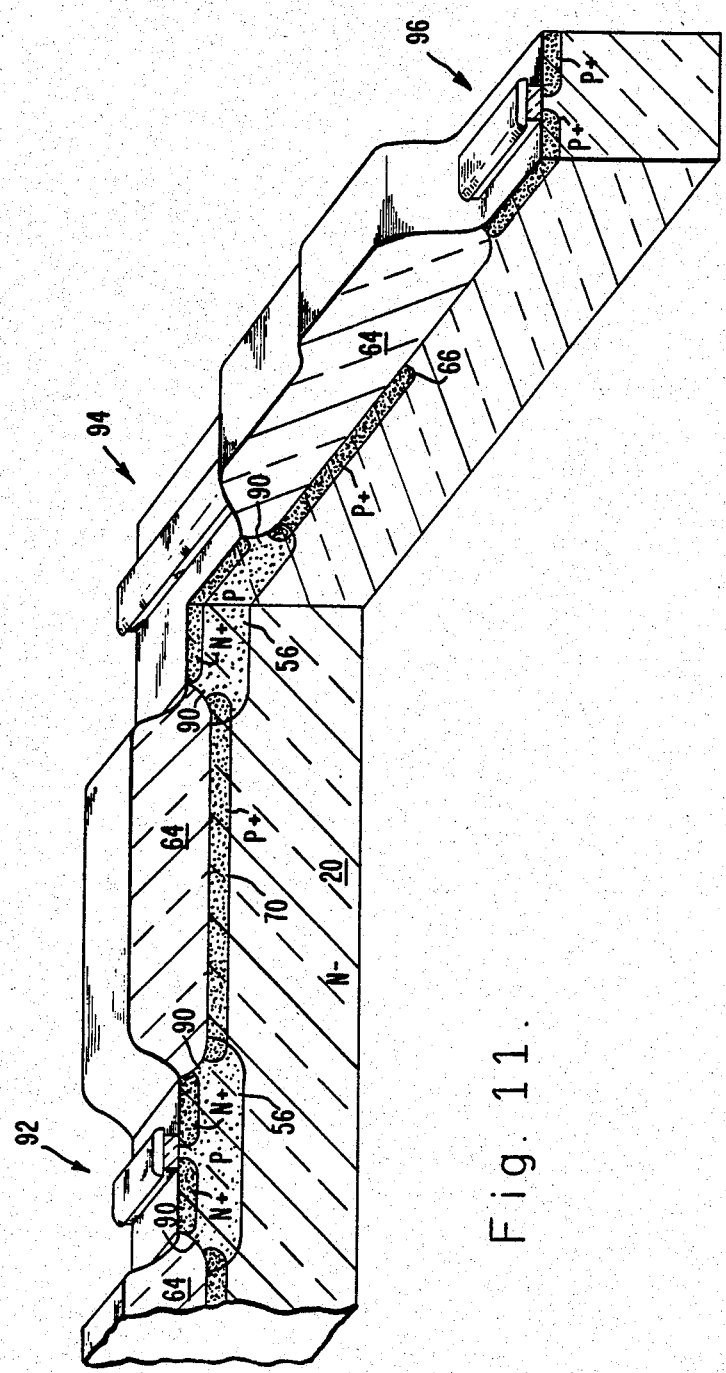
FIG. 11 is a cut away perspective illustration of a pair of HCMOS FET devices having conductively connected wells.

This interposed region 90 is also shown in FIG. 11. This figure provides a cutaway perspective illustration of two n-channel FET's 92, 94 whose adjacent p-wells 56 are conductively connected by a buried conductor 70, and a p-channel FET 96 electrically isolated from the p-wells by the channel stop 66.

Again referring to FIG. 10, an insulating layer of phosphosilicate glass 88 is then deposited conventional onto the surface of the n- and p-channel FETs 82, 86. Contact windows are then opened in the glass layer 88 above the source and drain regions. A window (not shown) is also opened for the well bias contact, the location of which may be over any one of the conductively interconnected well surface regions 34 or the buried conductor 70 as it extends between the wells 56. An aluminum layer 80 may then be vacuum deposited and appropriately etched to provide the required aluminum contacts and wiring pattern to combine pairs of n- and p-type FET devices into single CMOS FET devices. Finally, an overglass layer of silicon dioxide (not shown) may be deposited over the surface of the circuit to provide a reliable barrier against contamination.

Thus, there is disclosed a process of fabricating high density CMOS devices having channel stops that are automatically aligned with and spaced apart from the source and drain regions of their respective FET's and having wells that are conductively interconnected by a buried conductor.

Obviously, many modifications of the present invention are possible in light of the above description of the preferred embodiment. These modifications may include reversing the specific conductivity type of the substrate and regions formed therein, and changes in the specific impurities, the impurity concentrations, and the processing times and temperatures employed. The modifications may also include the fabrication of a doublewell structure, where both p-type and n-type wells are present on a single substrate, each of the wells of the same conductivity type being conductively interconnected by channel stops and buried conductors also of the same conductivity type. In addition, the specific details of the standard and well known oxide growth, photolithographic and phosphosilicate glass deposition steps have been omitted in order not to obscure the present process. It is thererfore to be understood that, within the scope of the appended claims, the invention may be practiced otherwise than as specifically described.

What is claimed is:

1. An integrated circuit structure comprising:
(a) a semiconductor substrate of a first conductivity type, said substrate having a major surface including a plurality of first surface regions elevated above a second surface region, said elevated first surface regions being joined to said second surface region by downwardly sloped surfaces;
(b) a plurality of separate and spaced apart well regions of a second conductivity type, each underlying and adjacent to a separate said elevated first surface region, the associated downwardly sloped surfaces, and an immediately surrounding portion of said second surface region;
(c) a plurality of parasitic channel stops of said second conductivity type, each located within said substrate, adjacent to a portion of said second surface region and a contiguous portion of said downwardly sloped surface encircling a separate said elevated first surface region, a portion of each said parasitic channel stop overlapping a portion of its associated well region;
(d) a buried conductor of said second conductivity type located within said substrate and adjacent to said second surface region, said buried conductor extending between and contiguous with a plurality of said parasitic channel stops, whereby a plurality of said well regions are conductively interconnected.

2. The integrated circuit structure of claim 1 further comprising a plurality of paired source and drain regions of said first conductivity type, each said pair being located within a separate said well region, each of said source and drain regions being adjacent to a portion of said elevated first surface region and spaced apart from said parasitic channel stops by interposed portions of said well regions.

3. An integrated circuit structure comprising:
   (a) a semiconductor substrate of a first conducitvity type having a major surface;
   (b) a plurality of separate and spaced apart well regions of a second conductivity type located within said substrate and adjacent to said major surface, the surface area of each of said well regions being insufficient for the fabrication of an insulated gate field effect transistor thereon;
   (c) a plurality of parasitic channel stops of said second conductivity type located within said substrate and adjacent to said major surface, each said channel stop encircling a separate one of said well regions, the inner margin of each said channel stop overlapping the outer margin of its associated well region; and
   (d) a buried conductor of said second conductivity type located within said substrate and adjacent said major surface, said buried conductor extending between and contiguous with a plurality of said parasitic channel stops, whereby a plurality of said well regions are conductively interconnected.

4. The integrated circuit structure of claim 3 further comprising source and drain regions of said first conductivity type located within each said well region and adjacent to said major surface, said source and drain regions being spaced apart from said parasitic channel stops by interposed portions of said well regions, said source and drain regions serving as the source and drain regions of an insulated gate field effect transistor.

* * * * *